United States Patent
Anton et al.

(10) Patent No.: US 12,207,652 B2
(45) Date of Patent: *Jan. 28, 2025

(54) COPPER-BASED ANTIMICROBIAL PVD COATINGS WITH WEAR INDICATOR

(71) Applicant: VAPOR TECHNOLOGIES, INC., Longmont, CO (US)

(72) Inventors: Bryce Randolph Anton, Longmont, CO (US); Nicholas Peterson, Arvada, CO (US)

(73) Assignee: Vapor Technologies, Inc., Longmont, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/533,717

(22) Filed: Nov. 23, 2021

(65) Prior Publication Data

US 2022/0174946 A1    Jun. 9, 2022

Related U.S. Application Data

(60) Provisional application No. 63/122,240, filed on Dec. 7, 2020.

(51) Int. Cl.
*A01N 25/34* (2006.01)
*A01N 59/00* (2006.01)
*A01N 59/16* (2006.01)
*A01N 59/20* (2006.01)

(52) U.S. Cl.
CPC ............ *A01N 25/34* (2013.01); *A01N 59/00* (2013.01); *A01N 59/16* (2013.01); *A01N 59/20* (2013.01)

(58) Field of Classification Search
CPC ........ A01N 25/34; A01N 59/00; A01N 59/16; A01N 59/20; A01P 1/00; C23C 14/0015; C23C 14/087
See application file for complete search history.

(56) References Cited

U.S. PATENT DOCUMENTS

| | | | |
|---|---|---|---|
| 5,454,886 | A | 10/1995 | Burrell et al. |
| 5,681,575 | A | 10/1997 | Burrell et al. |
| 5,753,251 | A | 5/1998 | Burrell et al. |
| 5,770,255 | A | 6/1998 | Burrell et al. |
| 5,958,440 | A | 9/1999 | Burrell et al. |

(Continued)

FOREIGN PATENT DOCUMENTS

| | | | |
|---|---|---|---|
| CN | 108070829 A | 5/2018 | |
| DE | 102012109272 A1 * | 4/2014 | ............. A61B 17/00 |

(Continued)

OTHER PUBLICATIONS

Li, Q., Zhao, M., Li, L., Dong, L., Wu, J., & Li, D. (May 2020). Co-regulation of Cu/Zn contents enhanced the biological and mechanical properties of TiN coated Ti-6Al-4V alloy. Surface and Coatings Technology, 395, 125943. (Year: 2020).*

(Continued)

*Primary Examiner* — Michael Zhang
(74) *Attorney, Agent, or Firm* — Brooks Kushman P.C.

(57) ABSTRACT

A bioactive coated substrate includes a base substrate, an indicator layer disposed over the base substrate, and a bioactive layer disposed on the indicator layer. Characteristically, the indicator layer has color sufficiently different from the bioactive layer to be visually perceived by a user when the bioactive layer wears away.

21 Claims, 1 Drawing Sheet

(56) References Cited

U.S. PATENT DOCUMENTS

| | | | |
|---|---|---|---|
| 6,238,686 B1 | 5/2001 | Burrell et al. | |
| 8,066,854 B2 | 11/2011 | Storey et al. | |
| 8,530,056 B2 | 9/2013 | Pilloy et al. | |
| 9,107,981 B2 | 8/2015 | Neumann et al. | |
| 2006/0240067 A1* | 10/2006 | Gillis | A61K 33/243 424/618 |
| 2007/0203574 A1* | 8/2007 | McGrath | C23C 14/221 623/1.46 |
| 2009/0162695 A1 | 6/2009 | Hevesi et al. | |
| 2009/0198343 A1 | 8/2009 | Spain et al. | |
| 2012/0094097 A1* | 4/2012 | Chang | C23C 14/345 204/192.15 |
| 2012/0244381 A1* | 9/2012 | Chang | C23C 14/0036 204/192.15 |
| 2013/0252021 A1* | 9/2013 | Neumann | A61L 27/54 106/18.32 |
| 2015/0361278 A1* | 12/2015 | Call | C09J 7/22 106/18.32 |

FOREIGN PATENT DOCUMENTS

| | | |
|---|---|---|
| EP | 2 202 330 A1 | 6/2010 |
| EP | 3004009 B1 | 8/2019 |
| EP | 3 587 616 A2 | 1/2020 |
| WO | WO-2022027077 A1 * | 2/2022 |

OTHER PUBLICATIONS

Techkon USA, A simple review of Cie δE* (Color Differenc) Equations, Sep. 11, 2018, https://techkonusa.com/a-simple-review-of-cie-Åe-color-difference-equations/ (Year: 2018).*

Espacenet Translation of DE-102012109272-A1 (Year: 2023).*

Espacenet Translation of WO-2022027077-A1 (Year: 2023).*

Kumar, D. Dinesh, and Gobi Saravanan Kaliaraj. "Multifunctional zirconium nitride/copper multilayer coatings on medical grade 316L SS and titanium substrates for biomedical applications." Journal of the Mechanical Behavior of Biomedical Materials 77 (2018) : 106-115. (Year: 2018).*

Borsa, D.M. et al. "Growth and properties of $Cu_3N$ films and $Cu_3N$/[gamma] -$Fe_4N$ bilayers," Applied Physics Letters (2002), v. 80, n. 10, pp. 1823-1825.

Chen, N-H et al., "Antimicrobial and Decorative Ion-Plated Copper-Containing Ceramic Coatings," Surface and Coatings Technology, v. 236, 12, (2013), pp. 29-35.

Chu, J.P. et al., "Sputter-deposited Cu/Cu(O) multilayers exhibiting enhanced strength and tunable modulus," ACTA Materialia, v. 58, n. 19, (2010), p. 6374.

Robertson, S.N. et al., "Investigation of the antimicrobial properties of modified multilayer diamond-like carbon coatings on 316 stainless steel," Surface and Coatings Technology (2016), v. 314, pp. 72-78.

Vishwakarma V. et al., "Bacterial Adhesion and Hemocompatability Behavior of TiN, $TiO_2$ Single and TiN/$TiO_2$ Multilayer Coated 316L Ss for Bioimplants," J. of Biometrics, Biomaterials and Biomedical Engineering Trans Tech Publications Switzerland (2015), v. 25, pp. 73-82.

Extended Search Report dtd Jun. 20, 2022 for EP Appn. No. 21212825, 18 pgs.

He, X. et al., "Biocompatibility, Corrosion Resistances and Antibacterial Activity of $TiO_2$/CuO Coating on Titanium," Ceramics Int'l, (2017), v. 43, n. 18, p. 16185-16195.

Partial Search Report & Written Opinion dated Apr. 28, 2022 for EP Appn. No. 21 21 2825, 16 pgs.

Office Action dated Sep. 21, 2023 for Chinese Appn. No. 202111483507.3 filed Dec. 7, 2021, 9 pgs. (no English translation).

Parvizi, J. et al., "Antibacterial Coatings and Antibacterial Materials," Prosthetic Joint Infection Clinical Practices and Considerations, 2020, p. 303 (English translation)—3 pgs total.

Third Office Action dated Jun. 12, 2024 for CN Appn. No. 202111483507.3 and English Translation, 12 pgs.

* cited by examiner

COPPER-BASED ANTIMICROBIAL PVD COATINGS WITH WEAR INDICATOR

CROSS-REFERENCE TO RELATED APPLICATIONS

This application claims the benefit of U.S. provisional application Ser. No. 63/122,240 filed Dec. 7, 2020, the disclosure of which is hereby incorporated in its entirety by reference herein.

TECHNICAL FIELD

In at least one aspect, the present invention relates to a coating system with bioactive properties that is formed by physical vapor deposition and/or related methods.

BACKGROUND

Physical vapor deposition (PVD) is a technique for thin film formation or coating a substrate. PVD involves vaporization of a material that then condenses on a surface, forming a coating layer. PVD can result in the deposit of macroparticles, which are often considered a defect. The macroparticles may be loosely bound to the coated layer. Mechanical processes can be used to remove these macroparticles, but removal leaves pinholes, which are also often considered defects. For example, cathodic arc evaporation (CAE), a form of PVD, involving a high current, low voltage arc on the surface of a cathodic target produces macroparticles. Because macroparticles and pinholes are recognized as defects, great effort to eliminate or reduce the size and quantity of macroparticles is afforded.

Coatings with bioactive properties can be useful for various purposes. Bioactive refers to a material having biological effects or physiological effects on living things. For example, a bioactive material includes a material resulting in a modification in the normal biological function or a physiological mechanism of a living thing. Bioactive, as used herein, includes beneficial and detrimental effects to microorganisms or modifications to the normal functioning of a microorganism. One common bioactive material is antimicrobial substances. Antimicrobial coatings serve many purposes. Generally, antimicrobial coatings inhibit the growth or kill microbes like viral, bacterial or fungal organisms. One particularly relevant example includes preventing the spread of communicable diseases by the use of antimicrobial materials. Antimicrobial materials may also serve hygienic purposes. The desire to prevent the spread of disease and for heightened hygiene has resulted in significant efforts to develop antimicrobial materials. The use of antimicrobial materials in health care facilities and health treatments can provide significant benefits. Health facilities, such as hospitals, present unique environments that combine high concentrations of germs and individuals with vulnerable immunities. Therefore, facilities such as hospitals greatly benefit from antimicrobial surfaces. Antimicrobial materials for medical equipment can reduce the burden of disinfecting and prevent the spread of disease. Further, affordable antimicrobial surfaces could present benefits on any surface that comes into contact with living things. For example, surfaces involved in cooking or commonly touched surfaces like doorknobs could greatly benefit from antimicrobial properties. Even primarily decorative surfaces, if affordable, could benefit from antimicrobial characteristics and assist in inhibiting the spread and growth of harmful or undesirable antimicrobial life.

But producing antimicrobial materials can be difficult and expensive. Further, antimicrobial properties may have other undesirable properties. For example, some antimicrobial materials may be too soft. Other antimicrobial materials may have poor abrasion resistance. Microban® is an antimicrobial coating that includes silver particles dispersed in an organic matrix. Antimicrobial coatings involving an organic matrix may have the aesthetic appearance of paint. In some applications, the appearance of paint may be undesirable. Some antimicrobial coatings may use nanoparticle vapor deposition to deposit nanoparticles with antimicrobial properties on the surface of a coating. For example, ABACO® from Protec, is an antimicrobial coating using nanoparticles. However, the use of nanoparticles can be complex and expensive. Further such coatings may have delicate surfaces or poor abrasion resistance. Another example of antimicrobial materials includes various metals. For example, silver is known to have antimicrobial properties. However, as stated above silver can be expensive, and its properties may not be suitable for many applications. For example, the appearance or abrasion resistance of silver may be unsuitable for certain applications.

Accordingly, there is a need for an antimicrobial coating that solves one or more of these problems or offers an alternative to current antimicrobial materials.

SUMMARY

In at least one aspect, a bioactive coated substrate is provided. The bioactive coated substrate includes a base substrate, an indicator layer disposed over the base substrate, and a bioactive layer disposed on the indicator layer. Characteristically, the indicator layer has color sufficiently different from the bioactive layer to be visually perceived by a user when the bioactive layer wears away.

In another aspect, a bioactive coated substrate is provided. The bioactive coated substrate includes a base substrate, a base layer disposed over the base substrate; and a plurality of alternating bioactive layers and interlayers disposed over the base layer. Characteristically, the base layer and/or at least one of the interlayers is an indicator layer that has a color sufficiently different from the bioactive layers to be visually perceived by a user when one or more of the bioactive layers wears away.

In still another aspect, a bioactive coated substrate is provided. The bioactive coated substrate includes a base substrate, an outermost bioactive layer disposed on the base substrate, and an indicator layer disposed below the outermost bioactive layer.

DETAILED DESCRIPTION

Figure 1A:
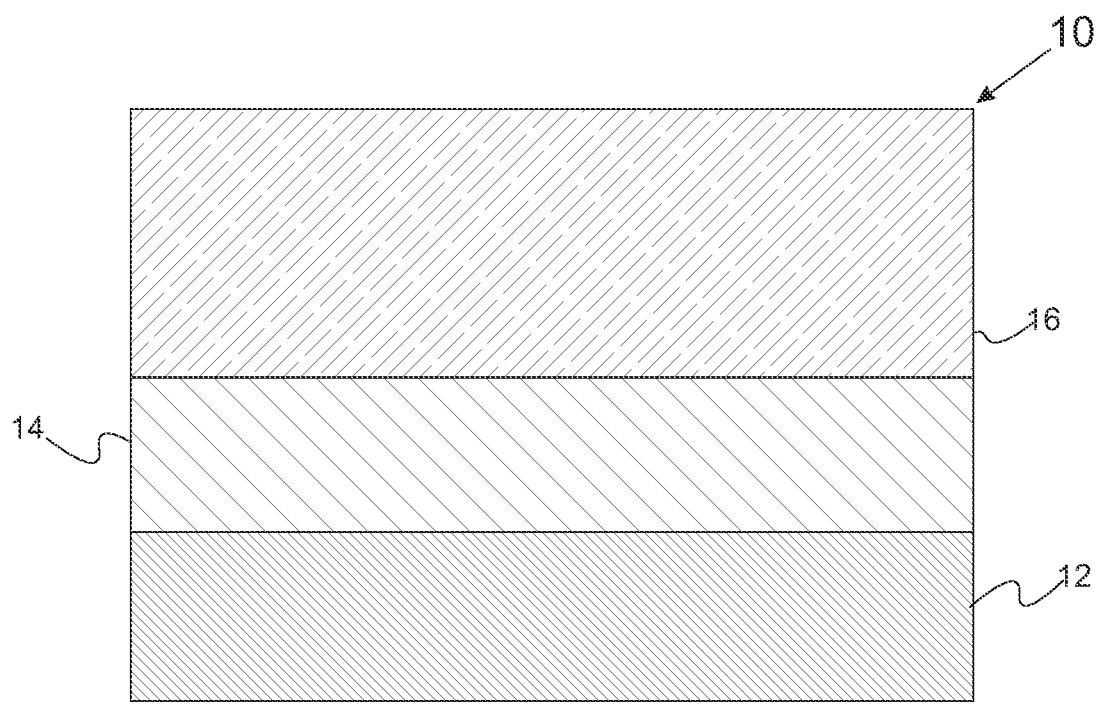
FIG. 1A is a schematic cross-section of a bioactive coated substrate with a bioactive layer and an indicator layer.

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It must also be noted that, as used in the specification and the appended claims, the singular form "a," "an," and "the" comprise plural referents unless the context clearly indicates otherwise. For example, reference to a component in the singular is intended to comprise a plurality of components.

The phrase "composed of" means "including" or "comprising." Typically, this phrase is used to denote that an object is formed from a material.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits. In the specific examples set forth herein, concentrations, temperature, and reaction conditions (e.g. pressure, flow rates, etc.) can be practiced with plus or minus 50 percent of the values indicated rounded to three significant figures. In a refinement, concentrations, temperature, and reaction conditions (e.g., pressure, flow rates, etc.) can be practiced with plus or minus 30 percent of the values indicated rounded to three significant figures of the value provided in the examples. In another refinement, concentrations, temperature, and reaction conditions (e.g., flow rates, etc.) can be practiced with plus or minus 10 percent of the values indicated rounded to three significant figures of the value provided in the examples.

In the examples set forth herein, concentrations, temperature, and reaction conditions (e.g., pressure, flow rates, etc.) can be practiced with plus or minus 50 percent of the values indicated rounded to or truncated to two significant figures of the value provided in the examples. In a refinement, concentrations, temperature, and reaction conditions (e.g., pressure, flow rates, etc.) can be practiced with plus or minus 30 percent of the values indicated rounded to or truncated to two significant figures of the value provided in the examples. In another refinement, concentrations, temperature, and reaction conditions (e.g., pressure, flow rates, etc.) can be practiced with plus or minus 10 percent of the values indicated rounded to or truncated to two significant figures of the value provided in the examples.

For all compounds expressed as an empirical chemical formula with a plurality of letters and numeric subscripts (e.g., $CH_2O$), values of the subscripts can be plus or minus 50 percent of the values indicated rounded to or truncated to two significant figures. For example, if $CH_2O$ is indicated, a compound of formula $C_{(0.8-1.2)}H_{(1.6-2.4)}O_{(0.8-1.2)}$. In a refinement, values of the subscripts can be plus or minus 30 percent of the values indicated rounded to or truncated to two significant figures. In still another refinement, values of the subscripts can be plus or minus 20 percent of the values indicated rounded to or truncated to two significant figures.

Throughout this application, where publications are referenced, the disclosures of these publications in their entireties are hereby incorporated by reference into this application to more fully describe the state of the art to which this invention pertains.

Abbreviations

"DLC" means diamond-like carbon.
"CAE" means cathodic arc evaporation.
"PVD" means physical vapor deposition.

Figure 1B:
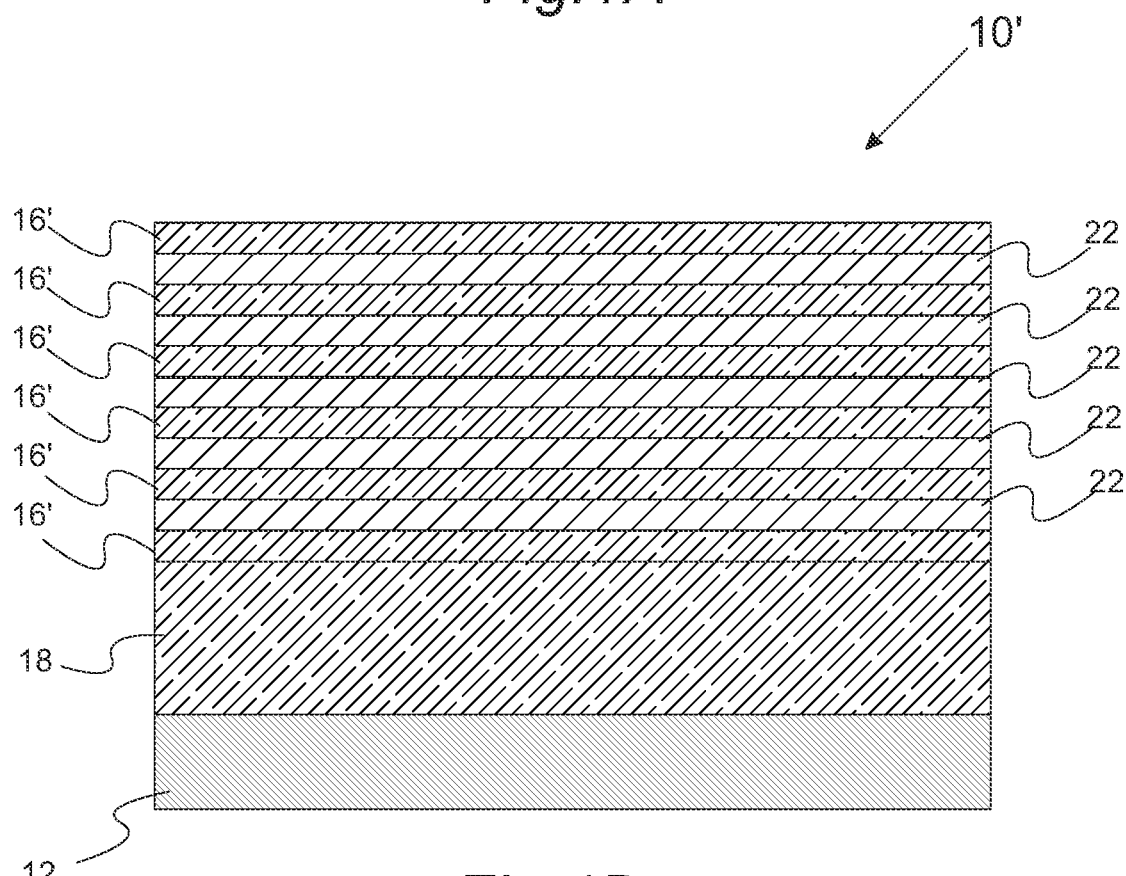
FIG. 1B is a schematic cross-section of a bioactive coated substrate having a plurality of alternating bioactive layers, interlayers, and at least one layer is an indicator layer.

FIGS. 1A and 1B provide cross sections of a substrate coated with a bioactive layer and having an indicator layer. Referring to FIG. 1A, bioactive coated substrate 10 includes a base substrate 12 and indicator layer 14 disposed over and optionally contacting the base substrate. The term "base substrate" refers to the substrate before is coated to form the bioactive substrate set forth below. Bioactive layer 16 is disposed over and optionally contacts indicator layer 14. Characteristically, indicator layer 14 can serve as a visual indication that the outermost bioactive layer 16 is compromised. In particular, the indicator layer has a color sufficiently different from the bioactive layer to be visually perceived by a user when the bioactive layer wears away thereby providing a visual alert to a user that bioactive layer 16 is compromised. With respect to setting the color of the various layers so that color differences can be determined, it should be appreciated that the color of each of the layers set forth above can independently be changed by adjusting the thicknesses and or stoichiometries of the layer. In a refinement, indicator layer 14 typically has a thickness from about 20 to 300 nm. In another refinement, the bioactive layer 16 has a thickness from about 50 to 1500 nm. Each of the layers of bioactive coated substrate 10 can be made by CVD, PVD which could be sputtering or CAE.

FIG. 1B provides a schematic cross-section of a bioactive coated substrate having a plurality of alternating bioactive layers and interlayers 22. In this variation, bioactive coated substrate 10' includes a base substrate 12 and optional base layer 18 disposed over and optionally contacting the base substrate. A plurality of alternating bioactive layers 16' and interlayers 22 are disposed over substrate 12 and base layer 18 if present. Typically, there can be 1 to 10 bioactive layers 16' and 1 to 10 interlayers 22. Characteristically, the base layer 18 and/or at least one of the interlayers 22 is an indicator layer. Typically, the outermost layer of coated substrate 10' is a bioactive layer. In a refinement, the base layer 18 and/or interlayers 22 can be composed of zirconium carbonitride, zirconium nitride, zirconium oxycarbide, zirconium oxynitride or zirconium oxycarbonitride. In another refinement, the interlayers 22 can also be bioactive layers but with a different thickness and/or stoichiometry than the bioactive layers it contacts on opposite faces. In this regard, interlayers 22 can be composed of various copper alloys, as set forth below. In another refinement, the interlayers 22 can be composed of a metal nitride. For example, interlayers 22 can be composed of zirconium nitride (ZrN), titanium nitride (TiN), zirconium oxycarbides (ZrOC), zirconium oxides (ZrO$_2$), diamond-like-carbon (DLC) or a combination thereof. In another variation, one or more of interlayers 22 can be an indicator layer. Each of the layers of bioactive coated substrate 10 can be made by CVD, PVD which could be sputtering or CAE.

In a refinement, base layer 18 and/or interlayers 22 each independently have a thickness from about 20 to 300 nm. In another refinement, the bioactive layer 16 has a thickness from about 50 to 1500 nm.

In some variations of the coated substrates depicted in FIGS. 1A and 1B, the indicator layer can be composed of zirconium carbonitride, zirconium nitride, zirconium oxycarbide, zirconium oxynitride or zirconium oxycarbonitride, titanium nitride, zirconium oxide, titanium oxide, or diamond like carbon. Indicator layer 14 typically has a thickness from about 20 to 300 nm. It should be appreciated that the present embodiment is not limited by the particular deposition methods for depositing indicator layer14 and bioactive layer 16. For example, these layers can be made by CVD, PVD which could be sputtering or CAE.

Bioactive layers 16 and 16' of FIGS. 1A and 1B can be any material with bioactive properties. In particular, the bioactive layers 16 and 16' are antimicrobial layers. Therefore, the bioactive layers 16 and 16' can include a material with antimicrobial properties. In a refinement, the bioactive layers 16 and 16' can be composed of a component (with antimicrobial properties) selected from the group consisting of bioactive metals, bioactive metal alloys, bioactive metal-containing compounds (e.g., metal oxides), and combinations thereof. For example, bioactive layers 16 and 16' can be composed of copper metal, silver metal, copper metal-containing compounds, silver metal containing compounds, and combinations thereof.

In another refinement, bioactive layers 16 and 16' can be composed of a component selected from the group consisting of include copper alloys, copper-containing compounds, and combinations thereof. Such copper-containing compounds include copper atoms in the +1 or +2 oxidation state or combinations of copper atoms thereof. Examples of copper-containing compounds include, but are limited to copper, copper oxides, copper nitrides, copper oxides containing carbon atoms, and combinations thereof. In one variation, copper alloys include copper and nickel. Typically, each copper alloy includes nickel in an amount from about 8 to 28 weight percent of the total weight of the bioactive layer with the copper being present in an amount from about 72 to 92 weight percent of the total weight of the bioactive layer. In a refinement, the copper alloy includes nickel in an amount from about 10 to 25 weight percent of the total weight of the bioactive layer and copper in an amount form about 75 to 90 weight percent of the total weight of the bioactive layer. In some variations, the copper alloy can independently include additional elements such as iron, zirconium, tungsten, chromium, and combinations thereof. In a refinement, each of these additional elements is independently present in an amount from about 0.01 to about 5 weight percent of the total weight of the bioactive layer. In a refinement, each of these additional elements are independently present in an amount from about 0.01 to about 5 weight percent of the total weight of the bioactive layer. Examples of copper alloys are CuVerro® White Bronze and CuVerro® Rose commercially available from Olin Brass located in Louisville, KY.

In other variations, the bioactive layers 16 and 16' include silver, a silver alloy, a silver-containing compound (e.g., a silver oxide), or any combination thereof. Other metals that can exhibit antimicrobial properties include but are not limited to gallium (Ga), gold (Au), magnesium (Mg), titanium (Ti), and zinc (Zn). The bioactive layers 14 and 14' can include a combination of metals, metal oxides or metal alloys. This includes, for example, a bioactive layer 14 that includes copper (Cu) and silver (Ag).

In one refinement, each of the one or more of the bioactive layers 16 and 16' are independently composed of $CuO_x$, where x is from 0.6 to 1.2. In another refinement, each of the one or more of the bioactive layers 14 and 14' independently composed of $CuO_aN_b$, where a is from 0.0 to 1.2 and b, is from 0.01 to 0.4. In still another refinement, each of the one or more of the bioactive layers 14 and 14' independently composed of $CuO_cC_d$, where c is from 0.0 to 1.2 and d, is from 0.01 to 0.4. In a variation, each of the one or more of the bioactive layers 14 and 14' independently composed of any combination of copper metal, $CuO_x$, $CuO_aN_b$, and $CuO_cC_d$; Therefore, each of the one or more of the bioactive layers 14 and 14' independently composed of a combination of copper metal, $CuO_x$, $CuO_aN_b$, and $CuO_cC_d$ or a combination of copper metal and $CuO_x$ or a combination of copper metal and $CuO_aN_b$, a mixture of copper metal and $CuO_cC_d$ or a combination of copper metal, $CuO_x$, and $CuO_aN_b$ or a combination of copper metal, $CuO_x$ and $CuO_cC_d$ or a combination of copper metal, $CuO_aN_b$, and $CuO_cC_d$ or a combination of $CuO_x$, $CuO_aN_b$, and $CuO_cC_d$ or a combination of $CuO_x$ and $CuO_aN_b$ or a combination of $CuO_aN_b$, and $CuO_cC_d$ or a combination of $CuO_x$, $CuO_aN_b$, and $CuO_cC_d$. Some suitable bioactive layers can be composed of $Cu_xO_y$, $Cu_xN_y$, $Cu_xO_yN_z$, and $Cu_xO_yC_z$ where x can be 1, 2, or 3; y can be 1, 2, or 3; and z can be 1, 2, or 3.

In another variation, the bioactive layer(s) is composed of a mixture of a copper metal alloy and a component selected from the group consisting of zirconium nitride, titanium nitride, zirconium oxycarbides, zirconium oxides, diamond-like-carbon, and combinations thereof.

In another variation, layers 16 and 16' are composed of a mixture of a copper alloy and at least one of zirconium nitride, titanium nitride, zirconium oxycarbides, zirconium oxides, or diamond-like-carbon.

Indicator layer 14, base layer 18, interlayers 22, and bioactive layers 16 and 16' can be applied to any suitable substrate 12. A suitable substrate 12 can be composed of any material that exhibits thermal stability at an operational (i.e., the temperature that the bioactive coated substrate is used at) or deposition temperatures for each of the layers. In particular, the substrate 12 should be thermally stable at a temperature of at least 80° C. In a refinement, the substrate 12 should be thermally stable at a temperature of at least 250° C. In some refinements, a suitable substrate 12 can be composed of any material that is electrically conductive. For example, suitable materials that the base substrate can be composed of include, but are not limited to, metals, metal alloys and/or carbon materials. Additional examples of suitable materials that the base substrate can be composed of include, but are not limited to, stainless steel, chromium-nickel plated brass, chromium-nickel-copper plated zinc, chromium-nickel-copper plated ABS plastic, and chromium-nickel-copper plated aluminum.

In another variation, base layer 18 and interlayers 22 are independently composed of zirconium or titanium, carbon, and nitrogen where zirconium is present in an amount of at least 50 mole percent with each of the carbon and nitrogen present in an amount of at least 0.02 and 0.1 mole percent, respectively. In a refinement, base layer 18 and interlayers 22 are independently composed of a compound having the following formula:

$$M_{1-x-y}C_xN_y$$

where M is zirconium or titanium and x is 0.0 to 0.3 and Y is 0.1 to 0.5. In a refinement, x is 0.0 to 0.2 and y is 0.2 to 0.3. In another refinement, x is at least in increasing order of preference 0.0, 0.02, 0.03, 0.04, 0.05, 0.07, or 0.09 and at most in increasing order of preference, 0.5, 0.4, 0.3, 0.25, 0.2, 0.15, or 0.11. Similarly, in this refinement, y is at least in increasing order of preference 0.1, 0.15, 0.2, 0.25, 0.27, or 0.29 and at most in increasing order of preference, 0.6, 0.5, 0.40, 0.35, 0.33, or 0.31. In a further refinement, the base layer is composed of zirconium carbonitride described by 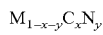 $Zr_{0.60}C_{0.10}N_{0.30}$.

In still another variation, base layer 18 and interlayers 22 are independently composed of zirconium or titanium, carbon, and oxygen where zirconium is present in an amount of at least 50 mole percent with each of the carbon and oxygen present in an amount of at least 0.02 and 0.1 mole percent, respectively. In a refinement, base layer 18 and interlayers 22 independently are independently composed of a compound having the following formula:

$$M_{1-x-y}O_xC_y.$$

where M is zirconium or titanium and x is 0.1 to 0.4 and y is 0.5 to 0.2. In a further refinement, the base layer is composed of zirconium oxycarbide described by $Zr_{0.50}O_{0.35}C_{0.15}$.

In accessing color differences between the indicator layer and bioactive layers 16 and 16', it should be appreciated that the bioactive layers 16 and 16' and indicator layer 14 (as well as the substrate and other layers) can be characterized by Lab color space coordinates L*, a*, and b* relative to CIE standard illuminant D50. In a refinement, at least one of Lab color space coordinates L*, a*, and b* relative to CIE standard illuminant D50 of the bioactive layer (e.g., typically the outermost bioactive layer) differs from that of the indicator layer by at least in increasing order of preference, 5%, 10%, 15%, 20%, 25% or 50%. In another refinement, each of the Lab color space coordinates L*, a*, and b* relative to CIE standard illuminant D50 of the bioactive layer (e.g., typically the outermost bioactive layer) differ from those of the indicator layer by at least in increasing order of preference, 5%, 10%, 15%, 20%, 25% or 50%. In a variation, Delta E (2000), which quantifies the distance between two points in the color space, can be used to quantify the difference between two colors. A visual or noticeable distinction between two colors can be impacted by various factors, including the viewer, the texture, and gloss. In a refinement, a delta E greater than or equal to 1.0 is a sufficient difference in color for the indicator. In another refinement, a delta E greater than or equal to 2.0 is a sufficient difference in color. In still another refinement, a delta E greater than or equal to 5.0 is a sufficient difference in color. In some variations, a delta E greater than or equal to, in increasing order of preference, 2.0, 5.0, 8.0, 10.0, 15.0, and 20.0, is a sufficient difference in color.

In another embodiment, the bioactive coated substrates of FIGS. 1A and 1B are included in an article. In a refinement, the useful article further includes an indicator layer as set forth above. Many healthcare or hospital surfaces may greatly benefit from a bioactive coated substrate. For example, useful articles can include but are not limited to bedrails, footboards, bed-side tables, knobs, handles, safety rails, carts, push plates, kick plates, mop plates, stretcher plates, spigots, drains, sinks, faucets, drain levers, water fountain components, sanitizers/soap dispensers, hand dryers, commonly used buttons, headrest, showerheads, countertops, hinges, locks, latches, trim, toilet or urinal hardware, light switches, armrest, thermostat controls, telephones, floor tiles, ceiling tiles, wall tiles, instrument handles (e.g. drug delivery systems, monitoring systems, hospital beds, office equipment, operating room equipment, stands and fixtures), IV poles, trays, pans, walkers, wheelchairs, keyboards, computer mouse surfaces, exercise equipment, rehabilitation equipment, physical therapy equipment, lamps, lighting systems, lids, hangers, remotes, cup holders, toothbrush holders, gown snaps, and window sills. Likewise, popular or common areas in general could benefit from articles with bioactive coated substrate s. For example, some articles or surfaces can include but are not limited to shopping carts, shopping cart handles, child seats, handrails, register keypads, register housings, ATMs, lockers, elevator controls, paper towel dispensers, toilet paper dispensers, vending machines, and restroom surfaces. Similar articles and surfaces can benefit in housing areas, mass transit, laboratories, religious gathering facilities, or any commonly visited facilities. Other uses can include but are not limited to writing utensils, eyeglass frames, combs, phone covers, tablet covers, headphone, and bottle openers to name a few.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A bioactive coated substrate comprising:
   a base substrate;
   an indicator layer disposed over the base substrate; and
   a bioactive layer disposed on the indicator layer where the indicator layer has color sufficiently different from the bioactive layer to be visually perceived by a user when the bioactive layer wears away, the bioactive layer being composed of a component selected from the group consisting of bioactive metals, bioactive metal alloys, bioactive metal-containing compounds, and combinations thereof, wherein the indicator layer is composed of zirconium carbonitride, zirconium nitride, zirconium oxycarbide, zirconium oxynitride, zirconium oxycarbonitride, titanium nitride, or diamond like carbon and wherein the bioactive layer is a top layer, wherein the bioactive layer has a thickness from about 50 to 1500 nm and the indicator layer has a thickness from 20 to 300 nm.

2. The bioactive coated substrate of claim 1, wherein the bioactive layer is composed of a component selected from the group consisting of copper metal, copper oxides, copper nitrides, copper oxides containing carbon atoms, and combinations thereof.

3. The bioactive coated substrate of claim 1, wherein the bioactive layer is composed of a component selected from the group consisting of copper metal, copper alloy, copper oxides, copper nitrides, copper oxides containing carbon atoms, and combinations thereof.

4. The bioactive coated substrate of claim 1 wherein the bioactive layer is composed of a component selected from the group consisting of include copper alloys, copper-containing compounds, and combinations thereof.

5. The bioactive coated substrate of claim 1 wherein the bioactive layer is composed of a mixture of a copper metal alloy and a component selected from the group consisting of zirconium nitride, titanium nitride, zirconium oxycarbides, zirconium oxides, diamond-like-carbon, and combinations thereof.

6. The bioactive coated substrate of claim 1 wherein the indicator layer is composed of zirconium carbonitride, zirconium nitride, zirconium oxycarbide, zirconium oxynitride, zirconium oxycarbonitride, or diamond like carbon.

7. The bioactive coated substrate of claim 1, wherein the bioactive layer is composed of $CuO_x$, where x is from 0.6 to 1.2.

8. The bioactive coated substrate of claim 1, wherein the bioactive layer is composed of $CuO_aN_b$, where a is from 0.0 to 1.2 and b, is from 0.01 to 0.4.

9. The bioactive coated substrate of claim 1, wherein the bioactive layer is composed of $CuO_cC_d$, where c is from 0.0 to 1.2 and d, is from 0.01 to 0.4.

10. The bioactive coated substrate of claim 1, wherein at least one of Lab color space coordinates L*, a*, and b* relative to CIE standard illuminant D50 of the bioactive layer differs from that of the indicator layer by at least 5%.

11. The bioactive coated substrate of claim 1, wherein each of Lab color space coordinates L*, a*, and b* relative to CIE standard illuminant D50 of the bioactive layer differs from those of the indicator layer by at least 5%.

12. The bioactive coated substrate of claim 1, wherein delta E for the bioactive layer and the indicator layer is greater than or equal to 2.0.

13. The bioactive coated substrate of claim 1, wherein delta E for the bioactive layer and the indicator layer is greater than or equal to 5.0.

14. A bioactive coated substrate comprising:
    a base substrate;
    a base layer disposed over the base substrate; and
    a plurality of alternating bioactive layers and interlayers disposed over the base layer, wherein the base layer and/or at least one of the interlayers is an indicator layer that has a color sufficiently different from the bioactive layers to be visually perceived by a user when one or more of the bioactive layers wears away, each bioactive layer being composed of a component selected from the group consisting of bioactive metals, bioactive metal alloys, bioactive metal-containing compounds, and combinations thereof, wherein the base layer and each interlayer is composed of zirconium carbonitride, zirconium nitride, zirconium oxycarbide, zirconium oxynitride, zirconium oxycarbonitride, titanium nitride, or diamond like carbon and wherein one of the bioactive layers is a top layer, wherein each bioactive layer has a thickness from about 50 to 1500 nm, each interlayer has a thickness from 20 to 300 nm, and the base layer has a thickness from 20 to 300 nm.

15. The bioactive coated substrate of claim 14, wherein each bioactive layer is composed of a component selected from the group consisting of copper metal, copper alloy, copper oxides, copper nitrides, copper oxides containing carbon atoms, and combinations thereof.

16. The bioactive coated substrate of claim 14, wherein the base layer and each interlayer is composed of zirconium carbonitride, zirconium nitride, zirconium oxycarbide, zirconium oxynitride, zirconium oxycarbonitride, or diamond like carbon.

17. The bioactive coated substrate of claim 14, wherein at least one of Lab color space coordinates L*, a*, and b* relative to CIE standard illuminant D50 of an outermost bioactive layer differs from that of the indicator layer by at least 5%.

18. The bioactive coated substrate of claim 14, wherein each of Lab color space coordinates L*, a*, and b* relative to CIE standard illuminant D50 of an outermost bioactive layer differs from those of the indicator layer by at least 5%.

19. The bioactive coated substrate of claim 14, wherein delta E for an outermost bioactive layer and the indicator layer is greater than or equal to 2.0.

20. The bioactive coated substrate of claim 14, wherein delta E for an outermost bioactive layer and the indicator layer is greater than or equal to 5.0.

21. A bioactive coated substrate comprising:
    a base substrate;
    an indicator layer disposed over the base substrate; and
    a bioactive layer disposed on the indicator layer where the indicator layer has color sufficiently different from the bioactive layer to be visually perceived by a user when the bioactive layer wears away, the bioactive layer being composed of $CuO_cC_d$, where c is from 0.0 to 1.2 and d is from 0.01 to 0.4, wherein the indicator layer is composed of zirconium carbonitride, zirconium nitride, zirconium oxycarbide, zirconium oxynitride, zirconium oxycarbonitride, titanium nitride, or diamond like carbon and wherein the bioactive layer is a top layer.

* * * * *